United States Patent
Wu

(10) Patent No.: US 9,629,241 B2
(45) Date of Patent: Apr. 18, 2017

(54) PRINTED CIRCUIT BOARD, BALL GRID ARRAY PACKAGE AND WIRING METHOD OF PRINTED CIRCUIT BOARD

(71) Applicant: BOE Technology Group Co., Ltd., Beijing (CN)

(72) Inventor: Yue Wu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/571,621

(22) Filed: Dec. 16, 2014

(65) Prior Publication Data

US 2016/0157346 A1 Jun. 2, 2016

(30) Foreign Application Priority Data

Nov. 28, 2014 (CN) .......................... 2014 1 0712072

(51) Int. Cl.
*H05K 1/11* (2006.01)
*H05K 1/18* (2006.01)
*H05K 3/34* (2006.01)

(52) U.S. Cl.
CPC ............. *H05K 1/113* (2013.01); *H05K 1/112* (2013.01); *H05K 1/115* (2013.01); *H05K 1/181* (2013.01); *H05K 3/3436* (2013.01); *H05K 2201/0959* (2013.01); *H05K 2201/09572* (2013.01); *H05K 2201/10734* (2013.01)

(58) Field of Classification Search
CPC ........ H05K 1/181; H05K 1/113; H05K 1/115; H05K 1/112
See application file for complete search history.

(56) References Cited

U.S. PATENT DOCUMENTS

| | | | |
|---|---|---|---|
| 5,615,477 A * | 4/1997 | Sweitzer | 29/840 |
| 6,076,726 A * | 6/2000 | Hoffmeyer et al. | 228/180.22 |
| 6,399,892 B1 * | 6/2002 | Milkovich et al. | 174/258 |
| 6,429,383 B1 * | 8/2002 | Sprietsma et al. | 174/260 |
| 2003/0064546 A1 | 4/2003 | McCormick et al. | |
| 2005/0136646 A1 | 6/2005 | Larnerd et al. | |
| 2010/0078211 A1 | 4/2010 | Kim et al. | |

FOREIGN PATENT DOCUMENTS

| CN | 2518245 Y | 10/2002 |
|---|---|---|
| CN | 1484934 A | 3/2004 |
| CN | 103153001 A | 6/2013 |

OTHER PUBLICATIONS

DuPont, "DuPont CB100 Conductive Via Plug Paste Technical Data Sheet", Oct. 2013.*
Jan. 3, 2017—(CN) First Office Action Appn 201410712072.9 with English Tran.

* cited by examiner

*Primary Examiner* — Jeremy C Norris
(74) *Attorney, Agent, or Firm* — Banner & Witcoff, Ltd.

(57) ABSTRACT

A printed circuit board, a ball grid array package and a wiring method of a printed circuit board are provided. The printed circuit board comprises: a substrate, the substrate including a plurality of insulating layers stacked and a plurality of conductive layers disposed between adjacent insulating layers; a plurality of pads, disposed in a two-dimensional matrix on a surface of the substrate; and a plurality of via holes, disposed corresponding to each pad and running through the substrate and the corresponding pad. The ball grid array package according to an embodiment of the invention comprises the above-described printed circuit board.

14 Claims, 10 Drawing Sheets

PRINTED CIRCUIT BOARD, BALL GRID ARRAY PACKAGE AND WIRING METHOD OF PRINTED CIRCUIT BOARD

This application claims priority to Chinese Patent Application No. 201410712072.9, filed on Nov. 28, 2014. The present application claims priority to and the benefit of the above-identified application and is incorporated herein in its entirety.

TECHNICAL FIELD

Embodiments of the invention relate to a printed circuit board, a ball grid array package and a wiring method of a printed circuit board.

BACKGROUND

With development of technology, chip integrated level is constantly improved, the number of I/O pins increases dramatically, power consumption also increases accordingly, and requirements on integrated circuit packaging are more stringent. In order to meet the needs of development, Ball Grid Array (briefly referred to as BGA) packaging begins to be used in production. The BGA is an advanced packaging technology which interconnects an integrated circuit (IC) and a substrate. The IC is adhered onto a plastic or a ceramic substrate. In a case of the BGA packaging, spherical solder balls attached to the IC package will be placed on an electrical connection pad of a printed circuit board (a circuit substrate) with a layer of flux. Then the circuit board will be heated to a certain temperature to melt the flux and all the solder balls, to fuse with a conductive pad formed on the printed circuit board below. Hence, the IC can be connected to the printed circuit board without an external lead.

In a printed circuit board layout (PCB Layout) stage, forms and specifications of the BGA packaging as well as a number of the pads decide that via holes must be disposed in the circuit board so that wires can be led out of positions of the pads, and be connected to other parts and electrical pads.

FIG. 1 is a structural schematic diagram of a conventional printed circuit board with a ball grid array structure. As illustrated in FIG. 1, a printed circuit board 100 has pads 110, via holes 120 and conductive circuits 130 disposed thereon. As can be seen from FIG. 1, all the via holes 120 are disposed in gaps between a plurality of pads 110. In this case, molding drawings are very messy, engineers of printed circuit board layout need to spend a lot of time to distinguish the pads required to be wired first. In addition, for such ball grid array used by the printed circuit board with a layout of such a high density, during wiring, even the outlets of the two peripheral rows of pads 110 must be connected to inner conductive layers through the via holes, but cannot be led out from a TOP layer. Thus, the via holes on the TOP layer have no practical meaning. Furthermore, in the conventional printed circuit board for the ball grid array structure, the pads and the inner layer circuits must be connected through the via holes by means of connecting lines, for example, as illustrated in FIG. 1, the adjacent pads and via holes are connected by connecting lines represented by thick lines and thin lines.

SUMMARY OF THE INVENTION

According to an embodiment of the invention, there is provided a printed circuit board, comprising:

A substrate, the substrate including a plurality of insulating layers stacked and a plurality of circuit layers disposed between adjacent insulating layers in a stacking direction, the substrate including a first surface and a second surface located on an opposite side to the first surface;

A plurality of pads, disposed in a matrix on the first surface of the substrate; and A plurality of via holes, disposed corresponding to each pad and running through the substrate and the corresponding pad.

In one example, an orthogonal projection of the via hole on a plane parallel to the substrate falls into a scope of orthogonal projection of the corresponding pad on the plane.

In one example, as seen in a plan view, a center of the via hole coincides with a center of the corresponding pad.

In one example, a part of the via hole close to the second surface of the substrate is filled with a resin material.

In one example, the resin material is not filled in a part of the via hole close to the first surface of the substrate.

In one example, the part of the via hole which is not filled with the resin material takes one-eighth or less of an entire depth of the via hole.

In one example, an inner wall of the via hole has a conductive layer adhered thereon, and at least one of the plurality of pads is electrically connected to a corresponding circuit layer in the substrate by the conductive layer on the inner wall of the corresponding via hole.

In one example, a solder resist is disposed in a region outside the pads on the first surface of the substrate.

In one example, the printed circuit board is used for ball grid array packaging, and the plurality of pads are used for connecting with solder balls in the ball grid array packaging.

According to another embodiment of the invention, there is provided a ball grid array package, comprising:

The printed circuit board according to any one of the above-described printed circuit board; and A ball grid array substrate, the ball grid array substrate including a plurality of solder balls disposed on one side thereof, the plurality of solder balls being arranged in a matrix on a surface of the ball grid array substrate, Wherein, the plurality of solder balls on the ball grid array substrate correspond to the plurality of pads on the printed circuit board one by one, and the ball grid array substrate is soldered to the pads on the printed circuit board by the plurality of solder balls.

In one example, a part of the solder ball extends into a part of via hole close to the first surface of the substrate in the printed circuit board.

In one example, the part of the via hole filled with the solder balls takes one-eighth or less of the entire depth of the via hole.

According to a further embodiment of the invention, there is provided a wiring method of a printed circuit board used for ball grid array packaging, comprising:

Forming a plurality of circuit layers, each circuit layer being sandwiched between adjacent insulating layers to form a circuit substrate having a plurality of circuit layers and a plurality of insulating layers stacked;

Forming a plurality of pads arranged in a matrix on a surface of the circuit substrate; and Forming a via hole through each pad and the printed circuit board, at least one of the plurality of pads being connected to a corresponding circuit layers through a corresponding via hole.

In one example, a conductive layer is formed on an inner wall of the via hole, at least one of the plurality of pads being electrically connected to the corresponding circuit layer through the conductive layer on an inner wall of the corresponding via hole.

In one example, the wiring method further comprises:

Filling the via hole with a resin material, and saving a part of the via hole not to be filled with the resin material in a part of the via hole close to the pad.

In one example, the wiring method further comprises:

Applying solder at each pad, a part of the solder flowing into the part of the via hole which is not filled with the resin material.

In one example, in the step of filling the via hole with the resin material, the part of the via hole which is not filled with the resin material takes one-eighth or less of an entire depth of the via hole.

In one example, an orthogonal projection of the via hole on a plane parallel to the circuit substrate falls into a scope of orthogonal projection of the corresponding pad on the plane.

In one example, as seen in a plan view, a center of the via hole coincides with a center of the corresponding pad.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DESCRIPTION OF THE EMBODIMENTS

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

According to embodiments of the invention, there are provided a printed circuit board for a ball grid array structure and a wiring method thereof. The printed circuit board for the ball grid array structure according to an embodiment of the invention will have via holes (e.g., which may be disposed in the centers of the pads) directly running through BGA pads, so that wiring of the printed circuit board is standard and beautiful, which greatly reduces wiring complexity for BGA wiring in a later stage, and clearly distinguishes the pads requiring wiring from the pads requiring no wiring in a more intuitive and neat way. The printed circuit board and the wiring method according to the embodiments of the invention can save time for layout design, and reduce difficulty of BGA wiring.

Moreover, the via holes are formed into passing through the BGA pads, in a process of manufacturing the printed circuit board, these via holes may be filled with resin, with a section of the hole depth left on the TOP side (i.e., a part which is not filled with the resin). For such a processing approach, a phenomenon of tin leakage during BGA soldering is firstly avoided. Secondly, stability of the BGA soldering can be increased.

Hereinafter, the printed circuit board for the ball grid array structure and the wiring method thereof will be illustrated in more detail in conjunction with specific examples.

Printed Circuit Board

Figure 2:
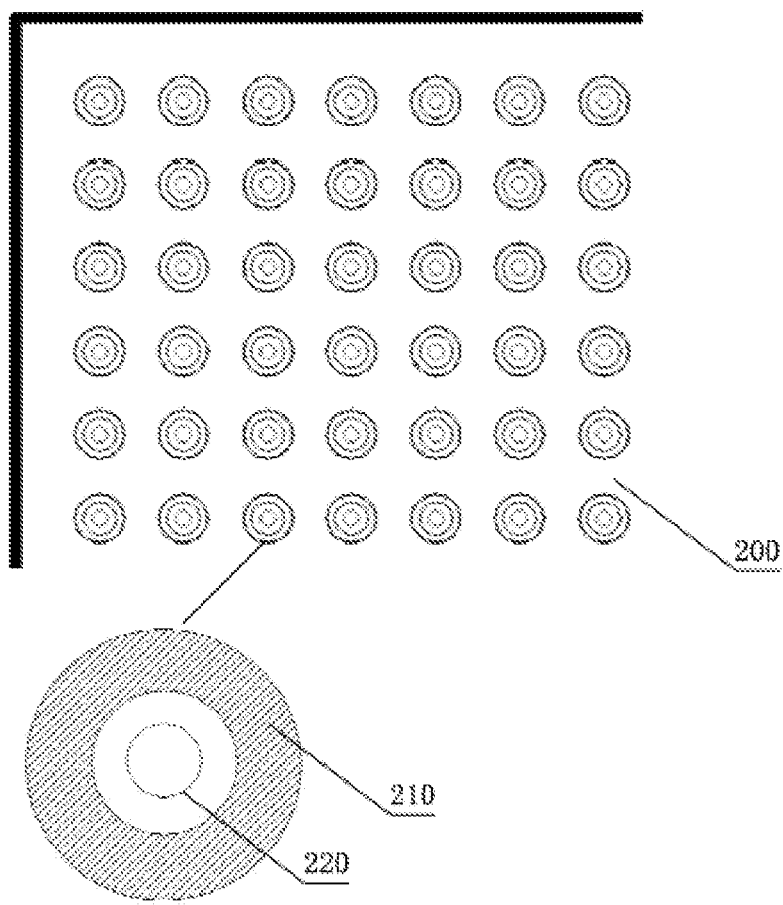
FIG. 2 is a partial plan schematic diagram of a printed circuit board for a ball grid array structure according to an embodiment of the invention.
Figure 3:
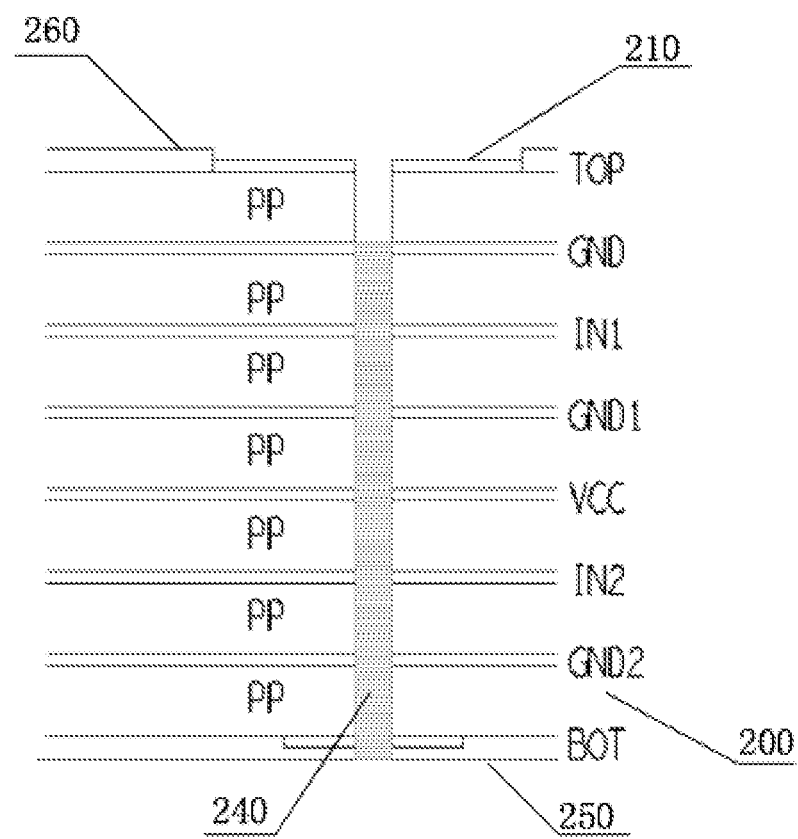
FIG. 3 is a partial cross-section schematic diagram of a printed circuit board for a ball grid array structure according to an embodiment of the invention.

FIG. 2 is a partial plan schematic diagram of a printed circuit board for a ball grid array structure according to an embodiment of the invention; FIG. 3 is a partial cross-section schematic diagram of a printed circuit board for a ball grid array structure according to an embodiment of the invention. As illustrated in FIG. 2 and FIG. 3, the printed circuit board comprises a substrate 200, pads 210 disposed on the substrate 200 and via holes 220 formed in the centers of the pads 210. As illustrated in FIG. 3, the substrate may have a top (TOP) side and a bottom (BOT) side, which, for example, may be referred to as a first surface and a second surface located on both sides of the substrate. For example, the substrate may be an epoxy glass cloth laminate, including a plurality of insulating layers (PP) stacked, and a plurality of conductive layers (circuit layers) sandwiched between adjacent insulating layers in a stacking direction. The conductive layers, for example include, but not limited to, ground layers (GND, GND1, GND2), input layers (IN1, IN2), power planes (VCC), etc. The conductive layers, for example, are made of copper wires or copper sheets. For example, each conductive layer is formed into a predetermined circuit pattern. Different conductive layers have different electrical properties, e.g., being connected to a ground terminal, being used for inputting a signal or being connected to a power supply etc. For example, the substrate may be made of an epoxy board (FR-4). In addition, the substrate of the printed circuit board according to the embodiment of the invention may be made of other materials, with other number of layers and other configuration of electrical properties for each layer, which will not be specifically limited by the invention.

It should be noted that, although it is illustrated with the via holes 220 being disposed in the centers of the pads 210 as an example in the drawings and the above description, yet the embodiments of the invention do not strictly limit that the via holes 220 must be in the centers of the pads 210. For example, orthogonal projections of the via holes 220 on a plane parallel to the circuit substrate fall into a scope of orthogonal projections of the corresponding pads 210 on the plane.

As illustrated in FIG. 2, the pads 210 are arranged in a matrix on the TOP side of the substrate 200. Spacing between the pads and size of the pads may be set according to needs, which will not be specifically limited by the invention. A lower part of FIG. 2 is an enlarged plane view around a pad. The pads 210 are used for electrically connecting with dies to be packaged by solder balls (typically of tin solder). As illustrated in FIG. 3, the via holes 220 run though the substrate 200 and the pads 210 along a thickness direction of the substrate 200. Since the pads 210 are connected with the solder balls in the process of ball grid array packaging, they can be referred to as ball grid array pads (BGA pads).

For example, the BGA pads on the TOP side are soldered with tin balls used in BGA packaging. The via holes in the BOT side do not afford a role in soldering, which, for example, are used for connecting with the wires of respective layers of the printed circuit board.

As illustrated in FIG. 3, on the TOP side, peripheries of the BGA pads 210 are covered with solder resist 260 (e.g., solder mask). That is to say, on a surface of the TOP side, the solder resist 260 is disposed in a region outside the BGA pads. On the BOT side, peripheries of the via holes are covered with solder resist 260. The solder resist located on the TOP side of the printed circuit board can present soldering around the BGA pads, and prevent short-circuit between adjacent pads.

For example, a planar shape of the pad may be a circular shape, when the via hole running through the BGA pad, more specifically, the BGA pad presents an annular shape. However, the specific shape of the BGA pad is not limited by the embodiments of the invention, and any suitable shape may be selected.

For example, the via hole 220 is substantially disposed in a center of each BGA pad 210, running through each BGA pad 210 and the substrate 200. For size selection of the via hole, a size (a diameter) thereof should be less than a size (a diameter) of the BGA pad. However, the diameter of the via hole needs to satisfy a width for wiring. For example, the diameter of the via hole 220 may be a half of the diameter of the BGA pad. In one example, as can be seen from the plan of FIG. 2, for example, the center of the via hole 220 coincides with the center of the BGA pad 210.

As illustrated in FIG. 3, for example, a part of the via hole 220 is filled with an insulating material such as a resin material 240. The resin material 240 is used for filling a bottom part of the via hole 220 (a part of the via hole 220 near the BOT side of the substrate). In the via hole 220 running through the substrate 200, a depth of filled hole (a depth filled with the resin material) is greater than or equal to seven-eighths of an entire depth of the via hole 220.

In one example, a part of the via hole 220 on the TOP side saves a part not to be filled with resin. For example, the part of the via hole 220 which is not filled with the resin material takes one-eighth or less of the entire depth of the via hole 220. When the via hole 220 is being filled with the resin material, preferably, a large part of the via hole 220 is filled, and only a small part is saved not to be filled with resin, whereby tin paste leakage into the hole can be controlled as far as possible, to avoid a case of too little tin paste used for the BGA soldering because too much tin paste leaks into the via hole, so occurrence of poor soldering can be prevented, which will be illustrated in more detail in the description of the wiring method of the printed circuit board hereinafter.

Figure 9:
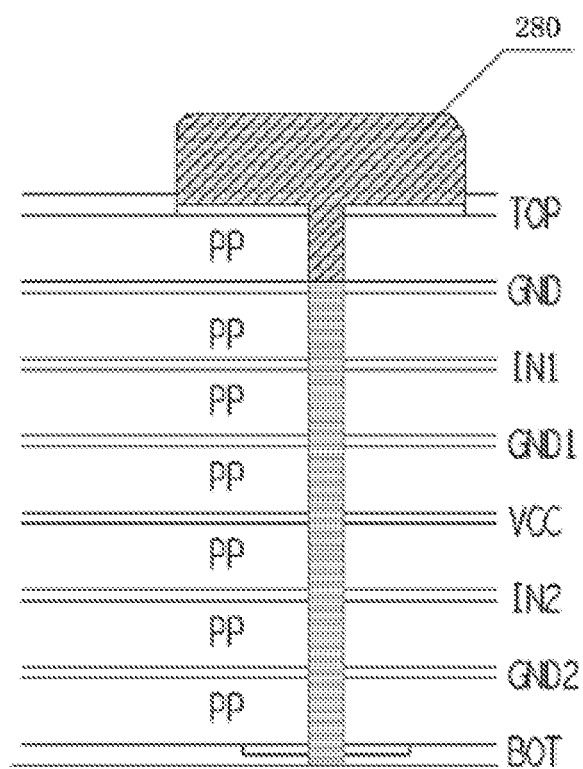
FIG. 9 is a structural schematic diagram after applying solder balls and performing heated soldering.

In the BGA packaging process, a die or the BGA substrate including the die will be soldered onto the printed circuit board via tin balls. The tin balls are connected with the inner conductive layers of the printed circuit board via the BGA pads, so that respective parts of the die can be connected with the inner conductive layers with various electrical properties in the printed circuit board, to complete the desired circuit structure. In the ball grid array packaging process, tin paste (tin balls) 280 may be formed onto the TOP side of the printed circuit board, and are correspondingly located on each BGA pad 210 (as illustrated in FIG. 9). A part of the tin paste 280 is filled in the part of the via hole 220 which is not filled with the resin material. During the BGA packaging process, the tin paste for welding is heated, and it flows into the via hole 220 to fill the part of the via hole 220 which is not filled with the resin material. As can be seen from the above description, a large part of the via hole 220 is filled, and a small part is saved not to be filled with resin. For example, the part of the via hole 220 which is not filled with the resin material takes one-eighth or less of the entire depth of the via hole 220. Thus, during BGA soldering, only a very small amount of tin paste flows into the hole when heated. In this case, tin leakage is not likely to occur. Moreover, when cooling after heated soldering, the tin paste flowing into the via hole 220 and the soldered surface (the TOP side) will be connected integrally, so that the tin paste 280 is not apt to fall off from the printed circuit board, so as to increase stability of the BGA soldering. After the BGA soldering, the tin paste 280 is not only affixed to the pad on the surface of the printed circuit board, but also has a part thereof fixed onto the inner wall of the via hole. For example, the tin paste 280 may be formed as a T-shaped structure, which enhances effect of a Surface Mount Technology (SMT) of the ball grid array packaging.

For the via holes 220, the electrical properties of each via hole 220 are identical to those of the BGA pad 210 where it is located, which means that when a hole is punched on a specific type of BGA pad, the via hole will naturally have the electrical properties of the BGA pad. For example, at least one of the plurality of pads 210 are connected to the internal circuit layers through the corresponding via holes. In one example, the inner wall of the via hole 220 has a conductive layer formed thereon. The conductive layer, for example, is made of metal copper. The BGA pad 220 may be electrically connected with the corresponding conductive layer inside the substrate through the conductive layer on the inner wall of the via hole 220. For example, ground pads may be electrically connected with the ground layers (GND, GND1, GND2) inside the substrate through the conductive layers on the inner walls of the corresponding via holes, input pads may be electrically connected with the input layers (IN1, IN2) inside the substrate through the conductive layers on the inner walls of the corresponding via holes, power pads may be electrically connected with the power layers (VCC) inside the substrate through the conductive layers on the inner walls of the corresponding via holes, while dummy pads are not electrically connected to any conductive layer inside the substrate.

In the printed circuit board according to the embodiment of the invention, it is not necessary for the respective BGA pads to be electrically connected to the conductive layers inside the substrate by connecting lines through the via holes around the BGA pads, while they can be electrically connected to the corresponding conductive layers inside the substrate directly through the conductive layers on the inner walls of the via holes. Therefore, the process can be greatly simplified. Moreover, the printed circuit board according to the invention can render the wiring of the printed circuit board standard and beautiful, which can clearly distinguish the pads requiring wiring from the pads requiring no wiring in a more intuitive and neat way, greatly reduce wiring complexity for BGA wiring in a later stage and save time for layout design.

Wiring Method of Printed Circuit Board

As can be seen from the above description, the printed circuit board according to the embodiment of the invention can simplify wiring complexity for BGA wiring in a later stage, and hereinafter, a wiring method of a printed circuit board with a ball grid array structure according to an embodiment of the invention will be illustrated in more detail in conjunction with one specific example.

Forming Via Holes in the Printed Circuit Board

Figure 4:
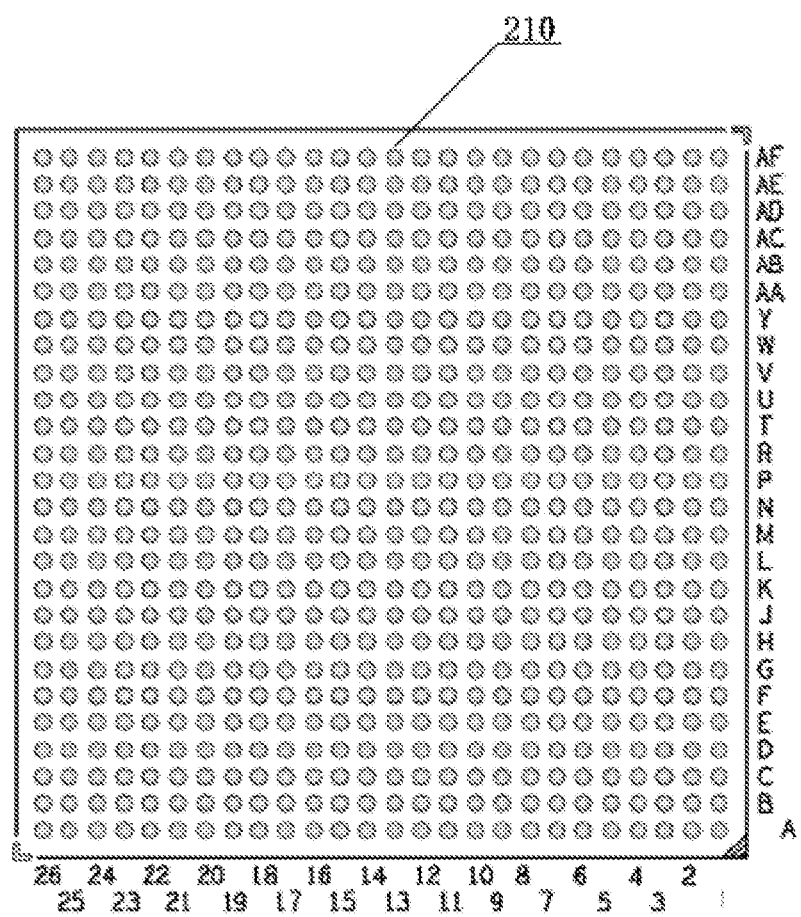
FIG. 4 is a schematic diagram of forming via holes in a printed circuit board having BGA pads formed thereon.

As described above with respect to the structure of the printed circuit board, a via hole is formed corresponding to a center of each BGA pad. Specifically, in the center of each BGA pad, the via hole running through a multilayer wiring board and the BGA is formed. In this step, all the BGA pads should be punched. The specific mode for forming the via hole is not particularly limited by the wiring method according to the embodiment of the invention, and any suitable punching method maybe used. FIG. 4 illustrates a plan schematic diagram of forming via holes on the printed circuit board having BGA pads formed thereon. The BGA pads 210 are distributed in a matrix on the surface of the printed circuit board, the center of each BGA pad 210 corresponding to the via hole formed, which will not be illustrated in detail, and FIG. 2 and FIG. 3 may be referred to for more details. In addition, it should be noted that the example illustrated in FIG. 4 only shows a two-dimensional matrix of 26×26, i.e., including 26 rows of A-AF, and 26 columns of 1-26. However, the number of the BGA pads of the printed circuit board according to the embodiment of the invention is not limited thereto, but a matrix of any number can be designed according to needs.

For size selection of the via hole, a size (a diameter) thereof should be less than a size (a diameter) of the BGA pad. However, the diameter of the via hole need to satisfy a width for wiring. For example, the diameter of the via hole 220 may be a half of the diameter of the BGA pad. In one example, the center of the via hole 220 coincides with the center of the BGA pad.

After the step of punching, electrical properties of the via hole become automatically identical to those of the pad where it is located. For example, a conductive layer may be formed in the inner wall of the via hole when the via hole is being formed. The conductive layer, for example, is made of metal copper. The electrical properties of each via hole 220 are identical to those of the BGA pad 210 where it is located, which means that when a hole is punched on a specific type of BGA pad, the via hole will naturally have the electrical properties of the BGA pad. The BGA pad 210 may be electrically connected with the corresponding conductive layer inside the substrate through the conductive layer on the inner wall of the via hole 220. For example, ground pads may be electrically connected with the ground layers (GND, GND1, GND2) inside the substrate through the conductive layers on the inner walls of the corresponding via holes, input pads may be electrically connected with the input layers (IN1, IN2) inside the substrate through the conductive layers on the inner walls of the corresponding via holes, power pads may be electrically connected with the power layers (VCC) inside the substrate through the conductive layers on the inner walls of the corresponding via hole, while dummy pads are not electrically connected to any conductive layer inside the substrate.

Marking Various Types of BGA Pads

Figure 5:
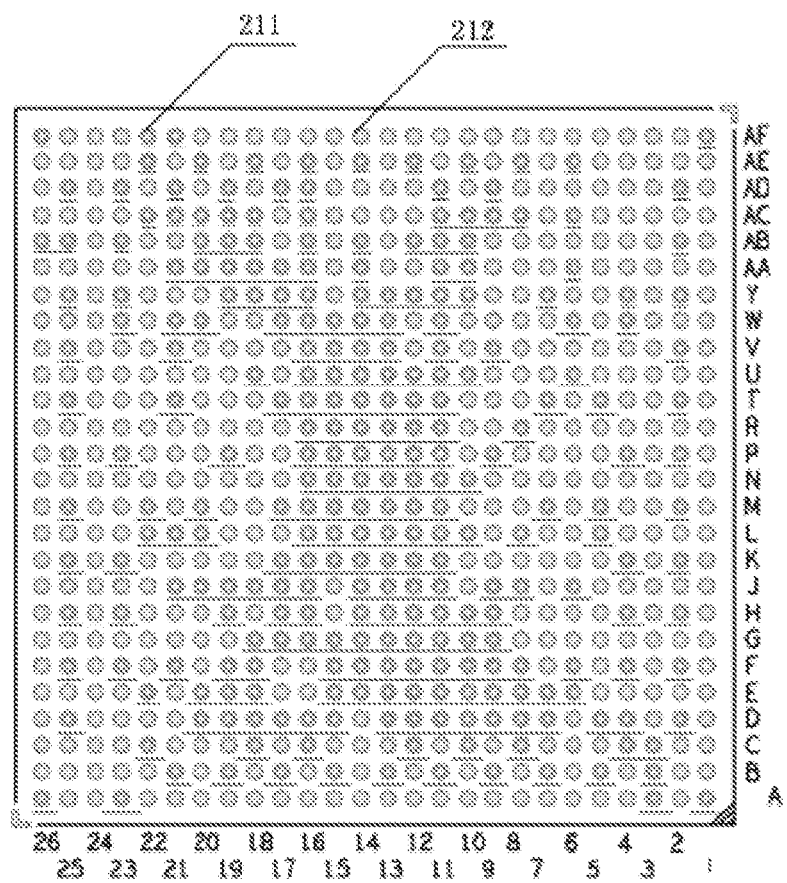
FIG. 5 is a schematic diagram with pads requiring wiring and pads requiring no wiring marked.

For example, the BGA pads may include pads requiring wiring and pads requiring no wiring. The pads may include power pads, ground pads, and dummy pads, etc. FIG. 5 is a schematic diagram with pads requiring wiring and pads requiring no wiring marked. As illustrated in FIG. 5, the pads requiring no wiring are marked with dashes below, the pads requiring no wiring are labeled by a reference sign "211", and the rest of the pads may be used for wiring and are labeled by "212". It should be noted that, here the being marked with "dashes" does not mean that the pads requiring no wiring must be marked with dashes in the process of layout design, but are marked with dashes merely for convenience of illustration. In the actual process of layout design, any suitable method can be used for marking the pads requiring wiring and the pads requiring no wiring.

In this step, it is necessary to clearly mark all the pads requiring no wiring (for example, the dummy pads). The dummy pads have no electrical property, and require no wiring. The power pads and the ground pads may be connected with the internal power planes and the ground planes through the via holes located thereon, which will be considered for corresponding simplification by the wiring engineers for their own design. Those pads requiring no wiring are found out, marked and clearly distinguished from other pads requiring wiring in a later stage.

Wiring

In this step, wiring of two peripheral rows of pads and wiring of internal pads may be included. In this step, the pads requiring wiring are connected with corresponding wiring layers (the circuit layers) inside a corresponding circuit substrate by the above via holes.

Figure 6:
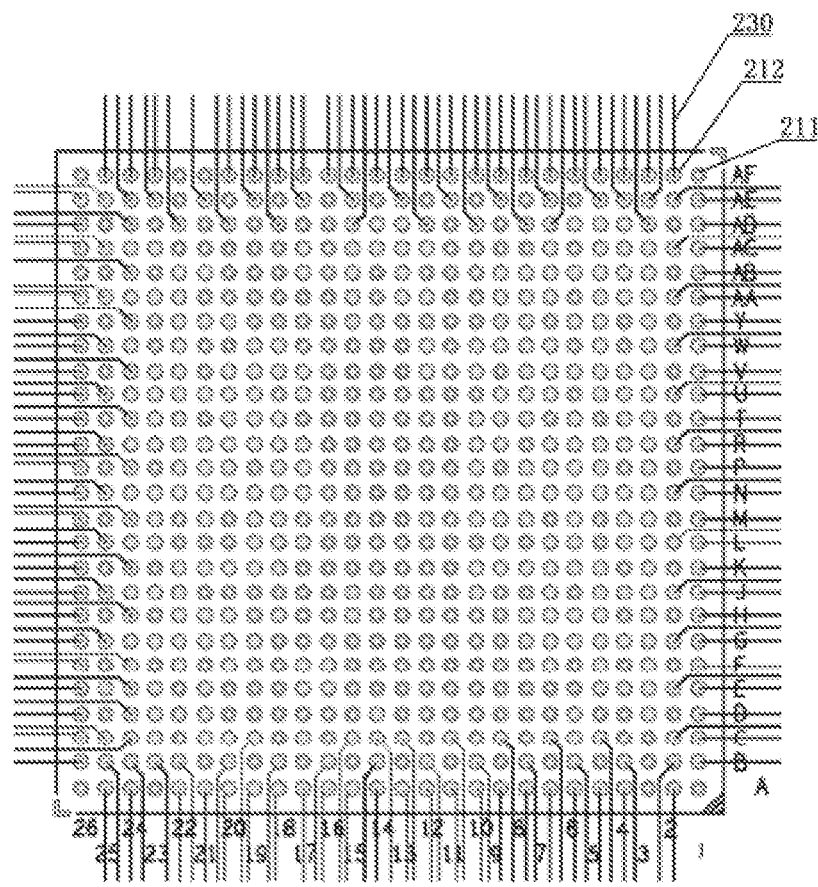
FIG. 6 is a design schematic diagram of wiring on two peripheral rows of pads.
Figure 7:
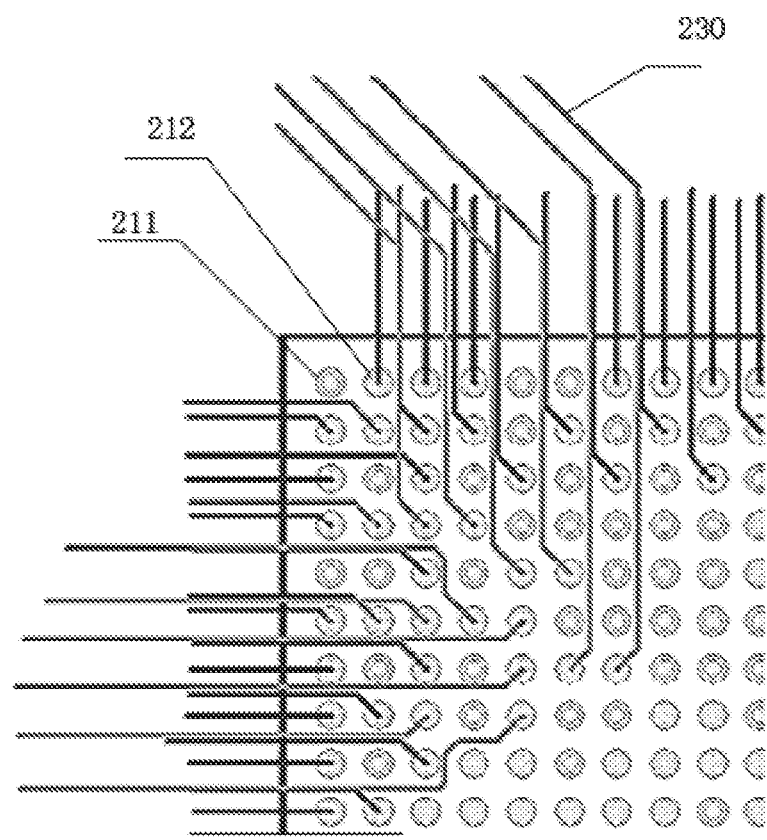
FIG. 7 is a design schematic diagram for wiring on internal pads.

FIG. 6 is a design schematic diagram of wiring on two peripheral rows of pads; and FIG. 7 is a design schematic diagram of wiring on internal pads. As seen from FIG. 6 and FIG. 7, the pads 212 requiring wiring are wired to connect to the corresponding conductive circuits 230, whereas the pads 211 require no wiring.

A conductive layer (a circuit layer) is selected, to lead out wires for the first two rows of the BGA. The conductive layer is a conductive layer inside the substrate, sandwiched between adjacent insulating layers. The conductive layer is formed into a predetermined circuit pattern as required, in order to meet the needs for transmitting a variety of signals. The insulating layer between the conductive layers plays a role for insulating different conductive layers.

Figure 1:
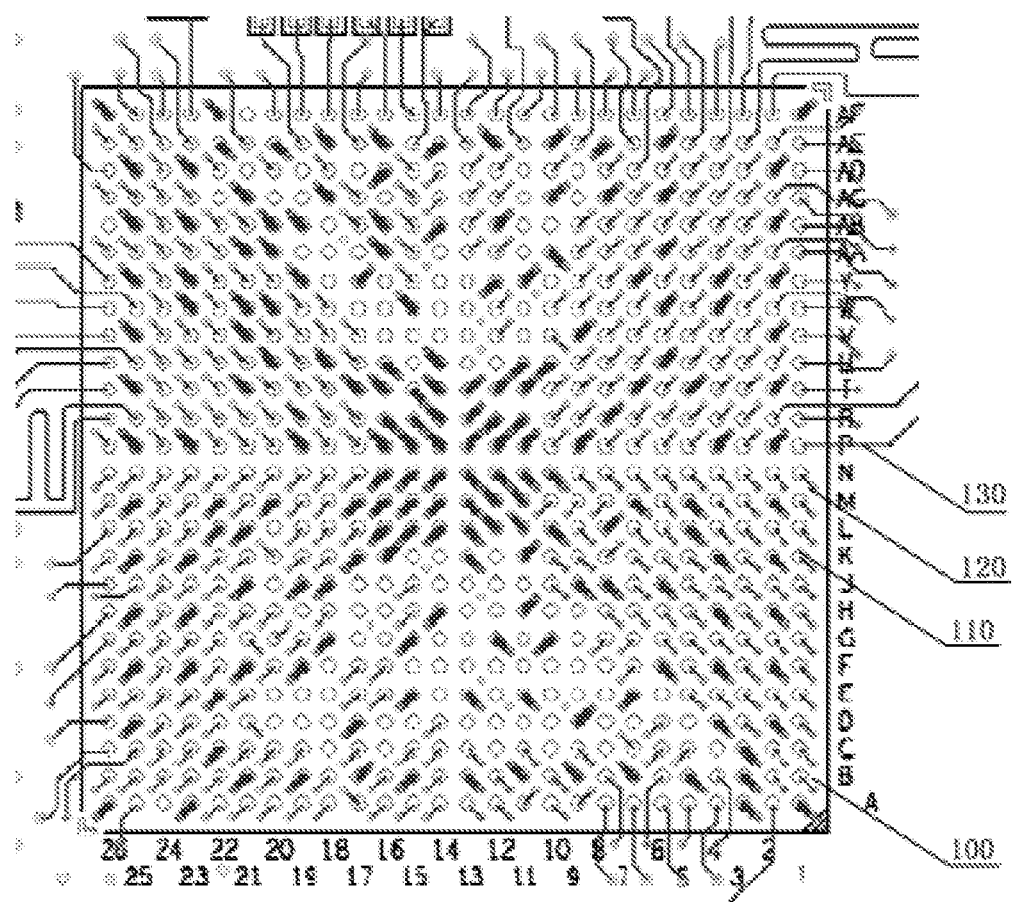
FIG. 1 is a structural schematic diagram of a conventional printed circuit board for a ball grid array structure.

As illustrated in FIG. 1, in the prior art, the via holes are formed in gaps between pads, and such molding drawings are very messy, so that engineers of printed circuit board layout need to spend a lot of time to distinguish the pads which require wiring first. Further, for such ball grid array used by the printed circuit board with a layout of high density, during wiring, the outlets of the two peripheral rows of pads must also be connected to inner conductive layers through the via holes, but cannot be led out from a TOP layer. Thus, the via holes on the TOP layer have no practical meaning.

In the printed circuit board according to the embodiment of the invention, it is not necessary for the respective BGA pads to be electrically connected to the conductive layers inside the substrate by connecting lines through the via holes around the BGA pads, while they can be electrically connected to the corresponding conductive layers inside the substrate directly through the conductive layers on the inner walls of the via holes. Therefore, the process can be greatly simplified. Moreover, the printed circuit board according to the invention can render the wiring of the printed circuit board standard and beautiful, which can clearly distinguish the pads requiring wiring from the pads requiring no wiring in a more intuitive and neat way, greatly reduce wiring complexity for BGA wiring in a later stage and save time for layout design.

FIG. 7 is a design schematic diagram of wiring internal BGA pads. As can be seen from FIG. 7, even if out-leading is completed for all the pads allowing wiring inside the BGA, the wiring of the BGA and overview of the power pads remain clear, and the wiring complexity is greatly reduced.

Hole Filling

The via holes formed in the above steps can be filled with a resin material. The resin material is not specifically limited by the wiring method according to the embodiment of the invention, and any suitable resin material can be selected for filling the via holes. FIG. 3 may be referred to for the diagram of the process steps.

As illustrated in FIG. 3, a part of the via hole located on the BOT side of the printed circuit board is filled with the resin material. In the via hole 220 running through the substrate 200, a depth of filled hole (a depth filled with the resin material) is greater than or equal to seven-eighths of the entire depth of the via hole 220.

In one example, a part of the via hole 220 on the TOP side saves a part not to be filled with resin. For example, the part of the via hole 220 which is not filled with the resin material takes one-eighth or less of the entire depth of the via hole 220. When the via hole 220 is being filled with the resin material, preferably, a large part of the via hole 220 is filled, and only a small part is saved not to be filled with resin, whereby tin paste leakage into the hole can be controlled as far as possible, to avoid a case of too little tin paste used for the BGA soldering because too much tin paste leaks into the via hole, so occurrence of poor soldering can be prevented.

Applying Solder

Figure 8:
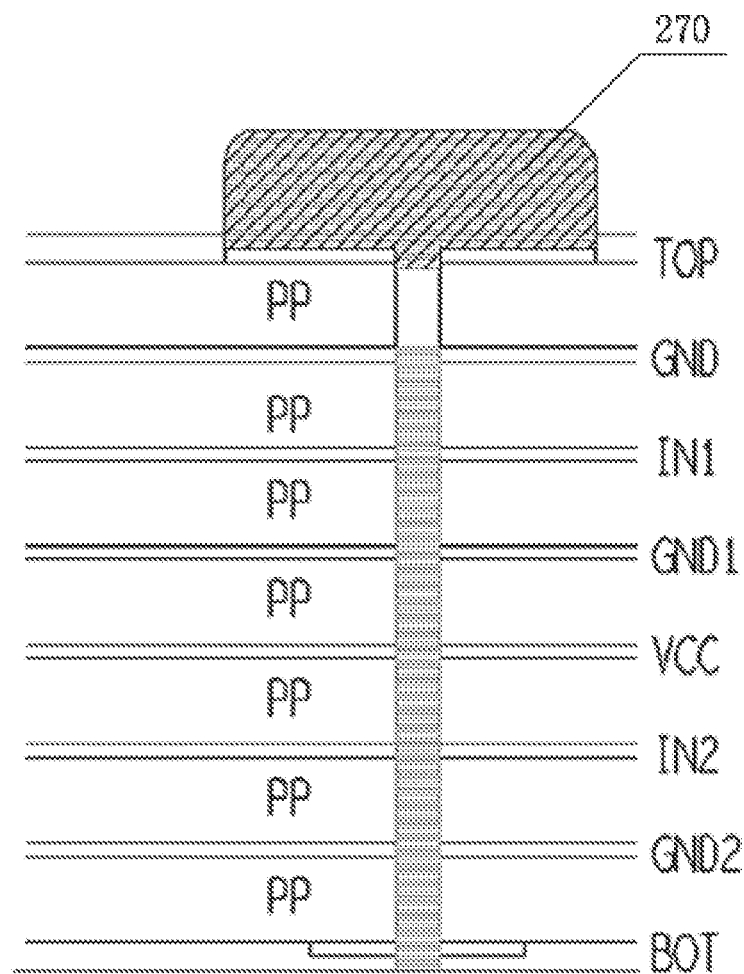
FIG. 8 is a structural schematic diagram representing pre-brushed tin paste.

In this step, the solder is applied to a position corresponding to each BGA pad, for electrically connecting the packaged die with the BGA pad during package soldering. For example, the solder here may be the tin paste. As illustrated in FIG. 8 and FIG. 9, the tin paste can flow into the part of the via hole which is not filled with the resin material.

When cooling after heated soldering, the tin paste flowing into the via hole 220 and the soldered surface (the TOP side) will be connected integrally, so that the tin paste 280 is not apt to fall off from the printed circuit board, so as to increase stability of the BGA soldering. After the BGA soldering, the tin paste 280 is not only affixed to the pad on the surface of the printed circuit board, but also has a part thereof fixed onto the inner wall of the via hole. For example, the tin paste 280 may be formed as a T-shaped structure, which enhances effect of a Surface Mount Technology (SMT) of the ball grid array packaging.

The step can be divided into two steps of pre-brushing tin paste and applying solder balls. FIG. 8 is a structural schematic diagram representing pre-brushed tin paste; and FIG. 9 is a structural schematic diagram after applying solder balls and performing heated soldering. In an early stage of soldering, the tin paste 270 is pre-brushed on the printed circuit board firstly, and part of the tin paste 270 will flow into the hole. If the tin paste are brushed manually, in order to ensure an amount of the tin paste, the engineers will repeat brushing for two to three times, which can ensure that part of the tin will flow into the hole during pre-brushing, to ensure the amount of the tin paste on the surface not to be reduced. If the tin paste is brushed automatically by a machine, the amount of the tin paste and the number of times for brushing the tin paste may also be adjusted to ensure adequate amount of the tin paste. Therefore, for the tin paste flowing into the hole with respect to the tin paste used for surface soldering of the BGA, the loss may be almost negligible.

After the tin paste is pre-brushed, the solder balls can be applied during soldering. The pre-brushed tin paste and the tin balls on the BGA packaged surface combine with each other after heating, fused into an integral whole (tin paste) 280, to complete BGA soldering. Therefore, the final amount of the tin paste (the tin paste 280) may be a sum of the amount of the pre-brushed tin paste (the tin paste 270) and the amount of the BGA packaged tin balls. Ingredients of the tin paste are not limited by the embodiment of the invention, and any tin paste suitable for soldering can be used.

It should be noted that the wiring method of the printed circuit board according to the embodiment of the invention is not limited to the above-described order of steps, but can be arbitrarily adjusted according to needs in actual production. One of the focal points of the wiring method according to the embodiment of the invention lies in the via holes running through the pads of the printed circuit board, which greatly simplifies the layout design of the printed circuit board and the wiring method. Therefore, the wiring method according to the embodiment of the invention, for example, may comprise steps of: forming a plurality of circuit layers, each circuit layer being sandwiched between adjacent insulating layers to form a circuit substrate having a plurality of circuit layers and a plurality of insulating layers stacked; forming a plurality of pads arranged in a matrix on a surface of the circuit substrate; and forming via holes through each pad and the printed circuit board, at least one of the plurality of pads being connected to a corresponding circuit layers through a corresponding via hole. For example, a conductive layer is formed on an inner wall of the via hole, at least one of the plurality of pads being electrically connected to the corresponding circuit layer through the conductive layer on an inner wall of the corresponding via hole. Of course, the wiring method may further comprise any other step described above, for example, the step of filling the via hole.

Ball Grid Array Package Structure

Figure 10:
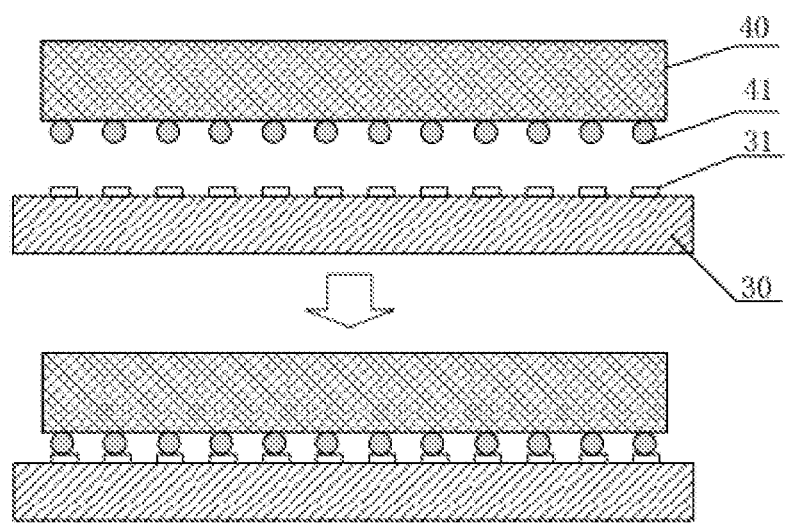
FIG. 10 is a simplified schematic diagram of a BGA package of a printed circuit board according to an embodiment of the invention.

The specific examples of the printed circuit board for the ball grid array structure and the wiring method according to the embodiments of the invention are described above. According to an embodiment of the invention, there is further provided a package using the above-described printed circuit board for the ball grid array structure. FIG. 10 is a simplified schematic diagram of a BGA package of the printed circuit board according to the embodiment of the invention.

As illustrated in FIG. 10, the package comprises a printed circuit board 30. The printed circuit board has BGA pads arranged in a matrix disposed thereon. The printed circuit board 30 is the printed circuit board according to any one of the above-described embodiments of the invention, so the printed circuit board also has structures such as via holes running through the BGA pads, which will not be described in detail here; and only a substrate and BGA pads 31 are illustrated in FIG. 10.

The package also comprises a ball grid array substrate (a BGA substrate) 40, the BGA substrate having solder balls (solder bumps) 41 arranged in a matrix disposed on the lower surface thereof. The solder balls 41 on the BGA substrate 40 correspond to the BGA pads on the printed circuit board one by one, that is to say, when the BGA substrate and the printed circuit board are soldered together, each BGA pad 31 corresponds to a solder ball 41.

In the soldering process, the solder is disposed in front of the BGA substrate 40 and the printed circuit board. As described above, in process of heated soldering, the solder flows into a part of the via hole on the printed circuit board which is not filled by the resin material. For example, the part of the via hole filled with the solder balls takes one-eighth or less of the entire depth of the via hole. Therefore, the solder flowing into the via hole and the solder on the soldered surface are connected integrally, so that the solder 41 is not apt to fall off from the printed circuit board, so as to increase stability of the BGA soldering. After the BGA soldering, the solder 41 is not only affixed to the pad on the surface of the printed circuit board, but also has a part thereof fixed onto the inner wall of the via hole. For example, the solder 41 may be formed as a T-shaped structure, which enhances effect of a Surface Mount Technology (SMT) of the ball grid array packaging. For example, the solder here may be the tin paste.

In one example, the BGA substrate 40 may include a base substrate and a die or a bare chip disposed on the base substrate. The bare chip and the solder balls 41 are respectively disposed on both sides of the base substrate. After the BGA substrate 40 and the printed circuit board 30 are soldered, the bare chip on the BGA substrate 40 may be electrically connected to the BGA pads of the printed circuit board, so as to be electrically connected with the corresponding conductive layers inside the printed circuit board.

In addition, the package may also comprise a cover layer disposed on one side of the printed circuit board on which the BGA substrate is disposed, the cover layer completely covering the soldered BGA substrate to protect it.

The foregoing embodiments merely are exemplary embodiments of the invention, and not intended to define the scope of the invention, and the scope of the invention is determined by the appended claims.

What is claimed is:

1. A printed circuit board, comprising:
    a substrate, the substrate including a plurality of insulating layers stacked and a plurality of circuit layers disposed between adjacent insulating layers in a stacking direction, the substrate including a first surface and a second surface located on an opposite side to the first surface;
    a plurality of pads, disposed in a matrix on the first surface of the substrate; and
    a plurality of via holes, each disposed corresponding to each pad and running through the substrate and the corresponding pad,
    wherein an inner wall of a corresponding via hole has a conductive layer adhered thereon, at least one of the plurality of pads is electrically connected to a corresponding circuit layer in the substrate by the conductive layer on the inner wall of the corresponding via hole, the via hole comprises a first portion filled with a resin material and a second portion not filled with the resin material, and the first portion filled with the resin material is disposed closer to the second surface of the substrate than the second portion not filled with the resin material.

2. The printed circuit board according to claim 1, wherein, an orthogonal projection of the via hole on a plane parallel to the substrate falls into a scope of an orthogonal projection of the corresponding pad on the plane.

3. The printed circuit board according to claim 1, wherein, in the stacking direction, a center of the via hole coincides with a center of the corresponding pad.

4. The printed circuit board according to claim 1, wherein, the second portion of the via hole filled with the resin material takes one-eighth or less of an entire depth of the via hole.

5. The printed circuit board according to claim 1, wherein, a solder resist is disposed in a region outside the pads on the first surface of the substrate.

6. The printed circuit board according to claim 1, wherein, the printed circuit board is used for ball grid array packaging, and the plurality of pads are used for connecting with solder balls in the ball grid array packaging.

7. A ball grid array package, comprising:
    a printed circuit board comprising:
        a substrate, the substrate including a plurality of insulating layers stacked and a plurality of circuit layers disposed between adjacent insulating layers in a stacking direction, the substrate including a first surface and a second surface located on an opposite side to the first surface;
        a plurality of pads, disposed in a matrix on the first surface of the substrate; and
        a plurality of via holes, each disposed corresponding to each pad and running through the substrate and the corresponding pad; and
    a ball grid array substrate, the ball grid array substrate including a plurality of solder balls disposed on one side thereof, the plurality of solder balls being arranged in a matrix on a surface of the ball grid array substrate,
    wherein, the plurality of solder balls on the ball grid array substrate correspond to the plurality of pads on the printed circuit board one by one, and the ball grid array substrate is soldered to the pads on the printed circuit board by the plurality of solder balls, and
    wherein, an inner wall of a corresponding via hole has a conductive layer adhered thereon, at least one of the plurality of pads is electrically connected to a corresponding circuit layer in the substrate by the conductive layer on the inner wall of the corresponding via hole, and a part of the solder ball extends into a part of via hole closer to the first surface of the substrate in the printed circuit board than to the second surface of the substrate in the printed circuit board.

8. The ball grid array package according to claim 7, wherein, an orthogonal projection of the via hole on a plane parallel to the substrate falls into a scope of an orthogonal projection of the corresponding pad on the plane.

9. The ball grid array package according to claim 7, wherein, the part of the via hole filled with the solder ball takes one-eighth or less of the entire depth of the via hole.

10. A wiring method of a printed circuit board used for ball grid array packaging, comprising:
    forming a plurality of circuit layers, each circuit layer being sandwiched between adjacent insulating layers to form a circuit substrate having a plurality of circuit layers and a plurality of insulating layers stacked in a stacking direction;
    forming a plurality of pads arranged in a matrix on a first surface of the circuit substrate;
    forming a plurality of via holes each running through each pad and the printed circuit board;
    forming a conductive layer on an inner wall of a corresponding via hole; and
    filling the via hole with a resin material, and saving a part of the via hole not to be filled with the resin material in a part of the via hole closer to the first surface of the circuit substrate on which the pad is formed than to a second surface of the circuit substrate disposed opposite to the first surface, wherein at least one of the plurality of pads is electrically connected to the corresponding circuit layer through the conductive layer on the inner wall of the corresponding via hole.

11. The wiring method according to claim 10, further comprising:

applying solder at each pad, a part of the solder flowing into the part of the via hole which is not filled with the resin material.

12. The wiring method according to claim 10, wherein, in the step of filling the via hole with the resin material, the part of the via hole which is not filled with the resin material takes one-eighth or less of an entire depth of the via hole.

13. The wiring method according to claim 10, wherein, an orthogonal projection of the via hole on a plane parallel to the circuit substrate falls into a scope of an orthogonal projection of the corresponding pad on the plane.

14. The wiring method according to claim 10, wherein, in the stacking direction, a center of the via hole coincides with a center of the corresponding pad.

* * * * *